United States Patent
Neumann (10) Patent No.: US 10,777,744 B2
(45) Date of Patent: Sep. 15, 2020

(54) RESISTIVE SWITCHING MEMORY CELL INCLUDING SWITCHABLE SOLID ELECTROLYTE HAVING DISCLOSED COMPOSITION

(71) Applicant: Heraeus Deutschland GmbH & Co. KG, Hanau (DE)

(72) Inventor: Christian Neumann, Hungen (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 0 days.

(21) Appl. No.: 16/076,148

(22) PCT Filed: Feb. 14, 2017

(86) PCT No.: PCT/EP2017/053217
§ 371 (c)(1),
(2) Date: Aug. 7, 2018

(87) PCT Pub. No.: WO2017/140646
PCT Pub. Date: Aug. 24, 2017

(65) Prior Publication Data
US 2019/0341548 A1    Nov. 7, 2019

(30) Foreign Application Priority Data
Feb. 17, 2016  (EP) ..................... 16156120

(51) Int. Cl.
*H01L 45/00* (2006.01)
(52) U.S. Cl.
CPC ........ *H01L 45/1253* (2013.01); *H01L 45/147* (2013.01); *H01L 45/1616* (2013.01); *H01L 45/1625* (2013.01); *H01L 45/1658* (2013.01)
(58) Field of Classification Search
CPC ............... H01L 45/1253; H01L 45/147; H01L 45/1616; H01L 45/1625; H01L 45/1658
See application file for complete search history.

(56) References Cited

U.S. PATENT DOCUMENTS 3,921,191 A * 11/1975 Merrin .................. C03C 21/00
  257/53
9,246,091 B1   1/2016 Wang et al.
(Continued)

FOREIGN PATENT DOCUMENTS

FR   3010075    3/2015
GB   1386098    3/1975
(Continued)

OTHER PUBLICATIONS

"New Processes in Modern ReRAM Memory Cells Decoded" by Jülich, Website, http://www.fz-juelich.de/SharedDocs/Pressemitteilungen/UK/DE/2015/15-09-28nnano_reram.html, Sep. 29, 2015, 2 pgs.

(Continued)

*Primary Examiner* — Matthew E. Gordon
(74) *Attorney, Agent, or Firm* — Stradley ROnon Stevens & Young, LLP (57) ABSTRACT

A resistive switching memory cell comprising a switchable solid electrolyte (E). The electrolyte (E) consists of a composition comprising a matrix comprising a metal oxide, metal sulphide and/or metal selenide as the matrix material, the metal oxide, metal sulphide and/or metal selenide comprising at least two metals M1 and M2, and a metal M3 which is mobile in the matrix. The atomic ratio of M1 to M2 is within the range of 75:25 to 99.99:0.01, preferably 90:10 to 99.99:0.01; the valence states of M1, M2 and M3 are all positive; the valence state of M1 is larger than the valence state of M2; the valence state of M2 is equal to or larger than the valence state of M3; and the metals M1, M2 and M3 are different.

15 Claims, 4 Drawing Sheets

(56) References Cited

U.S. PATENT DOCUMENTS

| | | | |
|---|---|---|---|
| 2006/0109708 | A1 | 5/2006 | Pinnow et al. |
| 2007/0034500 | A1 | 2/2007 | Stevenson et al. |
| 2009/0034123 | A1 | 2/2009 | Aoki et al. |
| 2009/0200535 | A1* | 8/2009 | Ufert .................. G11C 13/0011 257/3 |
| 2011/0068316 | A1 | 3/2011 | Takano et al. |
| 2011/0299340 | A1 | 12/2011 | Samachisa et al. |
| 2014/0356605 | A1 | 12/2014 | Adib et al. |
| 2015/0056509 | A1 | 2/2015 | Jeong et al. |
| 2015/0318333 | A1 | 11/2015 | Narayanan et al. |
| 2019/0084867 | A1 | 3/2019 | Neumann |

FOREIGN PATENT DOCUMENTS

| | | |
|---|---|---|
| JP | 2008276905 | 11/2008 |
| JP | 201166285 | 3/2011 |
| TW | 201230041 | 7/2012 |

OTHER PUBLICATIONS

Sung Hyun Jo, et al., "Cross-Point Resistive RAM Based on Field-Assisted Superlinear Threshold Selector", IEEE Transactions on Electron Devices, 2015, pp. 1-5.

Günther H. Frischat, "Sodium Diffusion in SiO2 Glass", Journal of the American Ceramic Society, vol. 51, No. 9, Sep. 1968, pp. 528-530.

Christina Schindler, et al., "Bipolar and Unipolar Resistive Switching in Cu-Doped SiO2", IEEE Transactions on Electron Devices, vol. 54, No. 10, Oct. 2007, pp. 2762-2768.

Wei-Kang Hsieh, et al., "Asymmetric resistive switching characteristics of In2O3:SiO2 cosputtered thin film memories", J. Vac. Sci. Technol. B, vol. 32, No. 2, Mar./Apr. 2014, 3 pgs.

European Search Report for European Patent Application No. 16156120.4 dated Jan. 16, 2017.

International Search Report for International Patent Application No. PCT/EP2017/053217 dated Jul. 14, 2017.

Translation of Office Action for Taiwan Patent Application No. 106104744, which cites TW201230041, dated Jan. 12, 2018.

Office Action dated Oct. 8, 2019 from corresponding Japanese Patent Application No. 2018-535285.

European Search Report dated Jan. 20, 2017 from European Patent Application No. 16156125.3.

International Search Report dated Jul. 14, 2017 from International Patent Application No. PCT/EP2017/053218.

Office Action dated Sep. 10, 2019 from Japanese Patent Application No. 2018-532209.

Translation of Office Action dated Oct. 3, 2017 from Taiwan Patent Application No. 106104743, which cites US20090200535.

* cited by examiner

RESISTIVE SWITCHING MEMORY CELL INCLUDING SWITCHABLE SOLID ELECTROLYTE HAVING DISCLOSED COMPOSITION

RELATED APPLICATIONS

This application is a U.S. national phase application of International Patent Application No. PCT/EP2017/053217 filed on Feb. 14, 2017 and published as international Publication No. WO 2017/140646 on Aug. 24, 2017. This application claims the benefit of priority to Patent Application No. 16156120.4 filed in Europe on Feb. 17, 2016, the contents of which are incorporated in this application by reference.

FIELD OF THE INVENTION

The present invention relates to a resistive switching memory cell, a process for the manufacture of a resistive switching memory cell and a memory device comprising the resistive memory switching cell.

BACKGROUND OF THE INVENTION

Non-volatile memory devices are used in a multitude of everyday electronics, e.g. smartphones, music players, USB-sticks, memory cards, e.g. for digital cameras, solid-state disks (SSDs) etc.

Non-volatile memories such as the so-called EPROM-technology has certain limits as regards the storage density, access, erase and writing times making it undesirable for the constantly increasing data volume in modern applications, such as the ones mentioned above.

A further technology for non-volatile memories are resistive switching memories which are formed of arrays of resistive switching elements. Each of these elements has two or more stable resistive states. Switching between the states is accomplished by specific voltage pulses.

Resistive switching elements use a "forming process" to prepare a memory device for use. The forming process is typically applied at the factory, at assembly, or at initial system configuration. A resistive switching material is normally insulating, but a sufficient voltage (known as a forming voltage) applied to the resistive switching material will form a conductive pathway in the resistive switching material. Through the appropriate application of various voltages (e.g. a set voltage and reset voltage), the conductive pathways may be modified to form a high resistance state or a low resistance state. For example, a resistive switching material may change from a first resistivity to a second resistivity upon the application of a set voltage, and from the second resistivity back to the first resistivity upon the application of a reset voltage which voltages are usually different from each other.

Two types of ReRAM switching elements are currently under investigation, namely valence change memory (VCM) and electrochemical metallization memory (ECM). In VCMs oxygen anions are removed from a metal oxide matrix whereupon the conductivity of the metal oxide matrix increases. In ECMs metal ions are reduced and build filaments within the matrix between the two electrodes thereby increasing the electrical conductivity. It has recently been found (cf. http://www.fz-juelich.de/SharedDocs/Pressemitteilungen/UK/DE/2015/15-09-28nnano_reram.html) that in VCMs in addition to the oxygen ion movement also filaments are formed. However, in VCMs elemental oxygen needs to be stored which may migrate to the surface of the electrode and cause delamination thereof.

In current solid state electrolytes usually amorphous metal oxides are used as a matrix whereby the transport of a metal ion therethrough leads to built-up and dissolution of a metallic filament between the two electrodes attached thereto.

After a multitude of switching processes the structure of the solid state electrolyte changes leading to separate metallic phases of the ion to be transported and, in turn continuously changes the switching behavior of the electrolyte making the switch unusable as memory. Moreover, a high degree of purity is desired in order to suppress side reactions and phase separations.

Thus, a resistive switching memory cell is needed which is not prone to changes in the switching behavior or which at least has a significant lower rate of change thereof due to the charge-state stabilization of the mobile ion in the matrix.

SUMMARY OF THE INVENTION

It has been found that this can be achieved by introducing a fixed local charge compensation element into the crystalline or amorphous matrix which has a lower valence state that the metal ion of the matrix.

Hence, the present invention provides a resistive switching memory cell comprising a switchable solid electrolyte (E), the electrolyte (E) consisting of a composition comprising:
  a matrix comprising a metal oxide, metal sulphide and/or metal selenide as the matrix, the metal oxide, metal sulphide and/or metal selenide comprising at least two metals M1 and M2;
  a metal M3 which is mobile in the matrix wherein the atomic ratio of M1 to M2 is within the range of 75:25 to 99.99:0.01, preferably 90:10 to 99.99:0.01;
  the valence states of M1, M2 and M3 are all positive;
  the valence state of M1 is larger than the valence state of M2;
  the valence state of M2 is equal to or larger than the valence state of M3; and
  the metals M1, M2 and M3 are different.

It has been found that the above switching element has a significantly improved switching behavior. It is the current understanding that the negative localized charge caused by the metal M2 in the matrix improves the ion hopping conductivity by simply enlarging the number of accessible hopping centers.

Moreover, the solubility of the metal M3 is also believed to be improved such that the build-up of localized phases, e.g. consisting of secondary metallic nanoparticles, is avoided or at least significantly reduced. Thus, the valence state of the metal M3 seems to be stabilized. Hence, undesired change of the switching behavior, especially changes of the set and reset voltages after a certain number of switching cycles, is significantly reduced and, thus, the lifetime of the device is improved. Moreover, the variation of the resistance of the respective resistance states around their respective maxima is lower (i.e. their Gaussian distribution is narrower) possibly enabling the use of three or more states within the same memory cell. Even in the case when only two states are used, these states are more clearly distinguished from each other. Moreover, the variation of the set and re-set voltages, respectively, of different cells having the same assembly is lower.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

The resistive switching memory cell is preferably a resistive switching memory cell based on electrochemical metallization (ECM).

In the present invention the term "metal" generally denotes the elements of the periodic table except hydrogen, the noble gases, the halogenides, B, C, N, O, P, S, Se and Te.

Composition of the Switchable Solid Electrolyte (E)

The valence states of M1, M2 and M3 are all positive. Thus, in an embodiment of the composition according to the present invention the metal is present in cationic form.

The metals M1, M2 and M3 are different. In the present invention this denotes that M1, M2 and M3 are each based on a different element of the periodic table.

As outlined above, the matrix comprises a metal oxide, metal sulphide and/or metal selenide as the matrix, the metal oxide, metal sulphide and/or metal selenide comprising at least two metals M1 and M2 and the atomic ratio of M1 to M2 is within the range of 75:25 to 99.99:0.01, preferably 90:10 to 99.99:0.01.

The matrix is a metal oxide, metal sulphide and/or metal selenide of the metal M1 wherein the metal M2 partially substitutes the metal M1. Due to the lower valence state of M2 compared with M1 localized negative charge results. This negative localized charge is believed to improve the mobility of the metal M3 and stabilizes its oxidation state.

The metal M3 is mobile in the matrix. Usually, the ratio of the diffusion coefficient of M3 in the composition to the diffusion coefficient of M2 in the composition is at least 1000:1, preferably at least 10,000:1, more preferably at least 100,000:1 and most preferably 1,000,000:1. The method for determining the diffusion coefficient is described in the experimental part below. Usually the ratio of the diffusion coefficients will not exceed $10^8$:1.

Preferably the diffusion coefficient of the metal M2 at 1100° C. is $1 \cdot 10^{-10}$ cm$^2$/s or below, more preferably $1 \cdot 10^{-10}$ cm$^2$/s or below and most preferably $1 \cdot 10^{-12}$ cm$^2$/s or below.

Preferably the diffusion coefficient of the metal M3 at 1100° C. is $1 \cdot 10^{-7}$ cm$^2$/s or higher, more preferably $5 \cdot 10^{-6}$ cm$^2$/s or higher and most preferably $1 \cdot 10^{-5}$ cm$^2$/s or higher.

The method for determining the diffusion coefficient is described in detail in the experimental part below.

The composition is preferably essentially free of alkaline metals and alkaline-earth metals. In the present invention "essentially free of alkaline metals and alkaline-earth metals" denotes that the total concentration of alkaline metals and alkaline-earth metals is below 100 ppm, based on the total weight of the composition.

Preferably, the total concentration of metals different from M1, M2 and M3 is below 100 ppm, based on the total weight of the composition.

As outlined above, the valence state of M2 is equal to or larger than the valence state of M3, preferably, the valence state of M2 is larger than the valence state of M3.

Preferably, the valence state of M1 is +III, +IV or +V, preferably +IV.

The valence state of M2 is lower than the valence state of M1. Preferably the valence state of M2 is +I to +III, more preferably +II or +III and most preferably +III.

Preferably the valence state of M3 is +I to +III, more preferably +I or +II.

In one embodiment, the valence state of M1 is +V, the valence state of M2 is +III or +IV and the valence state of M3 is +I to +III.

In another embodiment, the valence state of M1 is +IV, the valence state of M2 is +II or +III and the valence state of M3 is +I or +II.

In yet another, preferred embodiment the valence state of M1 is +IV, the valence state of M2 is +III and the valence state of M3 is +I or +II.

Preferably, M1 is selected from Si, Hf, Ta, Zr, Ti, Al, W and Ge, more preferably from Si, Ta, Al, W and Ge, even more preferably from Si and Ta and most preferably M1 is Si.

Preferably M2 is selected from the group consisting of B, Al, Ga, In, Tl, Sc, Y, La, Ac or mixtures thereof, preferably Al, Ga, and/or In and most preferably is selected from Al and/or Ga.

As outlined above, the metal M2 may also be a mixture of two or more metals, although M2 being a single metal is preferred.

M3 is preferably selected from the group consisting of Ag and Cu, and is most preferably Cu.

The atomic ratio of M1 to M2 is within the range of 75:25 to 99.99:0.01, preferably 90:10 to 99.99:0.01, more preferably within the range of 95.0:5.0 to 99.9:0.10, even more preferably within the range of 96.0:4.0 to 99.0:1.0.

Preferably,
the amount of M2 is 0.01 to 25 atom % based on the entirety of metals present in the composition; and/or
the amount of M3 is 0.01 to 10 atom % based on the entirety of metals present in the composition;
more preferably,
the amount of M2 is 0.1 to 10.0 atom % based on the entirety of metals present in the composition; and/or
the amount of M3 is 0.1 to 8.0 atom % based on the entirety of metals present in the composition;
even more preferably,
the amount of M2 is 1.0 to 5.0 atom % based on the entirety of metals present in the composition; and/or
the amount of M3 is 1.0 to 4.0 atom % based on the entirety of metals present in the composition.

Preferably,
the amount of M2 is 0.01 to 25 atom % based on the entirety of metals present in the composition; and
the amount of M3 is 0.01 to 10 atom % based on the entirety of metals present in the composition;
more preferably,
the amount of M2 is 0.1 to 10.0 atom % based on the entirety of metals present in the composition; and
the amount of M3 is 0.1 to 8.0 atom % based on the entirety of metals present in the composition;
even more preferably,
the amount of M2 is 1.0 to 5.0 atom % based on the entirety of metals present in the composition; and
the amount of M3 is 1.0 to 4.0 atom % based on the entirety of metals present in the composition.

In a preferred variant of the present invention the composition comprises
(iii) a matrix comprising a metal oxide as the matrix, the matrix comprising two metals M1 and M2, M1 being Si;
(iv) a metal M3 which is mobile in the matrix wherein the atomic ratio of M1 to M2 is within the range of 75:25 to 99.99:0.01, preferably 90:10 to 99.99:0.01;
the valence states of M1, M2 and M3 are all positive;
the valence state of M1 is +IV;
the valence state of M2 is +III or below;
the valence state of M2 is equal to or larger than the valence state of M3; and
the metals M1, M2 and M3 are different.

In the following preferred features of this variant are described.

In this variant the matrix is formed of amorphous or crystalline silicon dioxide, preferably amorphous silicon dioxide with the metal M2 partially replacing the silicon atoms.

The metal M3 is mobile in the matrix. Usually, the ratio of the diffusion coefficient of M3 to the diffusion coefficient of M2 is at least 1000:1, preferably at least 10,000:1, more preferably at least 100,000:1 and most preferably 1,000,000:1. The method for determining the diffusion coefficient is described in the experimental part below. Usually the ratio of the diffusion coefficients will not exceed $10^8$:1.

Preferably the diffusion coefficient of the metal M2 at 1100° C. is $1.10^{-10}$ cm$^2$/s or below, more preferably $1.10^{-10}$ cm$^2$/s or below and most preferably $1.10^{-12}$ cm$^2$/s or below.

Preferably the diffusion coefficient of the metal M3 at 1100° C. is $1.10^{-7}$ cm$^2$/s or higher, more preferably $5.10^{-6}$ cm$^2$/s or higher and most preferably $1.10^{-5}$ cm$^2$/s or higher.

The method for determining the diffusion coefficient is described in detail in the experimental part below.

The composition is preferably essentially free of alkaline metals and alkaline-earth metals. In the present invention "essentially free of alkaline metals and alkaline-earth metals" denotes that the total concentration of alkaline metals and alkaline-earth metals is below 100 ppm, based on the total weight of the composition.

Preferably the total concentration of metals different from M1, M2 and M3 is below 100 ppm, based on the total weight of the composition.

As outlined above, the valence state of M2 is equal to or larger than the valence state of M3, preferably, the valence state of M2 is larger than the valence state of M3.

Preferably the valence state of M2 is +I to +III, more preferably +II or +III and most preferably +III.

Preferably the valence state of M3 is +I to +III, more preferably +I or +II.

Preferably the valence state of M2 is +III and the valence state of M3 is +I or +II.

Preferably M2 is selected from the group consisting of B, Al, Ga, In, Tl, Sc, Y, La or Ac, preferably Al, Ga, and/or In and most preferably is selected from Al and/or Ga.

M3 is preferably selected from the group consisting of Ag and Cu, and is most preferably Cu.

In one embodiment of this variant, M2 is selected from the group consisting of Al, Ga, and/or In and
M3 is Cu.

The atomic ratio of M1 to M2 is within the range of 75:25 to 99.99:0.01, more preferably 90:10 to 99.99:0.01, preferably within the range of 95.0:5.0 to 99.9:0.10, more preferably within the range of 96.0:4.0 and 99.0:1.0.

Preferably,
the amount of M2 is 0.01 to 25 atom % based on the entirety of metals present in the composition; and/or
the amount of M3 is 0.01 to 10 atom % based on the entirety of metals present in the composition;
more preferably,
the amount of M2 is 0.1 to 10.0 atom % based on the entirety of metals present in the composition; and/or
the amount of M3 is 0.1 to 8.0 atom % based on the entirety of metals present in the composition;
even more preferably,
the amount of M2 is 1.0 to 5.0 atom % based on the entirety of metals present in the composition; and/or
the amount of M3 is 1.0 to 4.0 atom % based on the entirety of metals present in the composition;
Preferably,
the amount of M2 is 0.01 to 25 atom % based on the entirety of metals present in the composition; and
the amount of M3 is 0.01 to 10 atom % based on the entirety of metals present in the composition;
more preferably,
the amount of M2 is 0.1 to 10.0 atom % based on the entirety of metals present in the composition; and
the amount of M3 is 0.1 to 8.0 atom % based on the entirety of metals present in the composition;
and most preferably,
the amount of M2 is 1.0 to 5.0 atom % based on the entirety of metals present in the composition; and
the amount of M3 is 1.0 to 4.0 atom % based on the entirety of metals present in the composition.

In the following preferred features of various embodiments of the invention are described unless explicitly stated to the contrary.

In one embodiment
M1 is selected from Si, Ta, Zr, Ti, Al, W and Ge, more preferably from Si, Ta, Zr and Ti and most preferably M1 is Si;
M2 is selected from the group consisting of B, Al, Ga, In, Tl, Sc, Y, La, Ac or mixtures thereof, preferably Al, Ga, and/or In and most preferably is selected from Al and/or Ga; and
M3 is selected from the group consisting of Ag and Cu, and most preferably is Cu.

In another embodiment
M1 is selected from Si, Ta, Zr and Ti and most preferably M1 is Si;
M2 is selected from the group consisting of Al, Ga, and/or In and most preferably is selected from Al and/or Ga; and
M3 is selected from the group consisting of Ag and/or Cu and most preferably is Cu.

In yet another embodiment
M1 is Si;
M2 is Al; and
M3 is Cu.

In one further variant
M1 is selected from Si, Ta, Zr, Ti, Al, W and Ge, more preferably from Si, Ta, Zr and Ti and most preferably M1 is Si;
M2 is selected from the group consisting of B, Al, Ga, In, Tl, Sc, Y, La, Ac or mixtures thereof, preferably Al, Ga, and/or In and most preferably is selected from Al and/or Ga; and
M3 is selected from the group consisting of Ag and Cu, and most preferably is Cu;
the total concentration of metals different from M1, M2 and M3 is below 100 ppm, based on the total weight of the composition and
the amount of M2 is 0.01 to 25 atom % based on the entirety of metals present in the composition; and/or, preferably and
the amount of M3 is 0.01 to 10 atom % based on the entirety of metals present in the composition;
more preferably,
the amount of M2 is 0.1 to 10.0 atom % based on the entirety of metals present in the composition; and/or, preferably and
the amount of M3 is 0.1 to 8.0 atom % based on the entirety of metals present in the composition;
even more preferably,
the amount of M2 is 1.0 to 5.0 atom % based on the entirety of metals present in the composition; and/or, preferably and
the amount of M3 is 1.0 to 4.0 atom % based on the entirety of metals present in the composition.

In another variant
M1 is selected from Si, Ta, Zr and Ti and most preferably M1 is Si;
M2 is selected from the group consisting of Al, Ga, and/or In and most preferably is selected from Al and/or Ga; and
M3 is selected from the group consisting of Ag and/or Cu and most preferably is Cu the total concentration of metals different from M1, M2 and M3 is below 100 ppm, based on the total weight of the composition
and
the amount of M2 is 0.01 to 25 atom % based on the entirety of metals present in the composition; and
the amount of M3 is 0.01 to 10 atom % based on the entirety of metals present in the composition;
more preferably,
the amount of M2 is 0.1 to 10.0 atom % based on the entirety of metals present in the composition; and
the amount of M3 is 0.1 to 8.0 atom % based on the entirety of metals present in the composition;
even more preferably,
the amount of M2 is 1.0 to 5.0 atom % based on the entirety of metals present in the composition; and
the amount of M3 is 1.0 to 4.0 atom % based on the entirety of metals present in the composition.

In yet another variant
M1 is Si;
M2 is Al; and
M3 is Cu;
the total concentration of metals different from M1, M2 and M3 is below 100 ppm, based on the total weight of the composition
and
the amount of M2 is 0.1 to 10.0 atom % based on the entirety of metals present in the composition; and
the amount of M3 is 0.1 to 8.0 atom % based on the entirety of metals present in the composition;
preferably,
the amount of M2 is 1.0 to 5.0 atom % based on the entirety of metals present in the composition; and
the amount of M3 is 1.0 to 4.0 atom % based on the entirety of metals present in the composition.

The switchable solid electrolyte as defined in the present invention can be applied in a normal resistive switching memory cell.

Such a resistive switching memory cell is usually comprises
(vi.) a substrate;
(vii.) a first electrode applied onto the substrate;
(viii.) the switchable solid electrolyte (E) according to the present invention applied onto the first electrode;
(ix.) optionally a layer selected from the chalcogenides of Ag, Cu, e.g. sulphides, selenides and tellurides, especially selenides and tellurides, more preferably chalcogenides of Cu, e.g. sulphide, selenide and telluride, especially telluride;
(x.) a second electrode applied onto the switchable solid electrolyte (E) or the optional layer selected from the chalcogenides of Ag, Cu, e.g. sulphides, selenides and tellurides, if present.

Suitable materials for the substrate and the first and second electrode are known in the art.

Suitable substrates are known in the art.

Usually the substrate features CMOS logic for addressing specific cells for read and/or write operations.

Furthermore, usually the second electrode is connected to an interconnector as known in the art.

After depositing a dielectric layer on the interconnector applied onto the second electrode a three-dimensional structure can be obtained by applying layers (ii) to (v) onto the dielectric layer. This may be repeated several times.

Preferred substrates are selected from silicon-based 1T1R CMOS logic circuitry or 1TnR crossbar logic for improved storage density optionally comprising so-called selectors as, for example, described in S. H. Jo, et al., Cross-Point Resistive RAM Based on Field-Assisted Superlinear Threshold Selector, IEEE Transactions on electron devices, Vol. 62, no 11, November 2015, p. 3477-3481.

Figure 4:
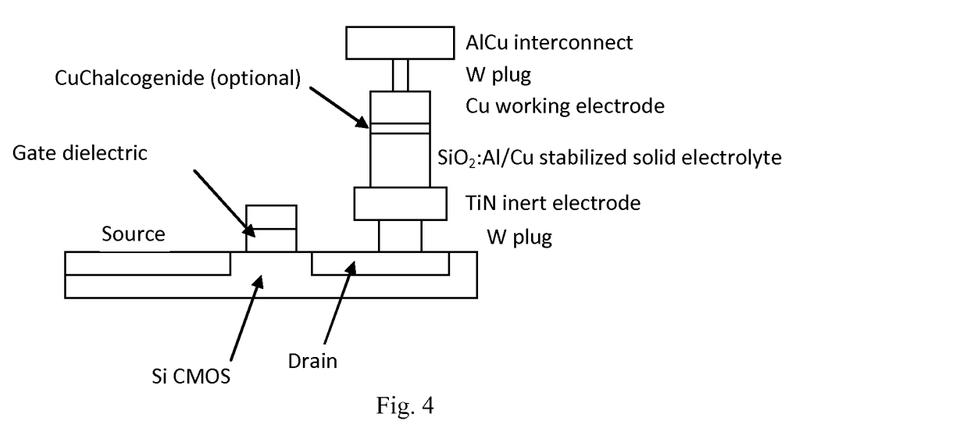
FIG. 4 shows an example of an 1T1R assembly.

An example for an 1T1R assembly is given in FIG. 4. In case of a cross-bar assembly the CMOS-logic is replaced by an interconnector and the CMOS-logic is applied to address the interconnector lines and rows of the assembly.

Preferably the materials of the first electrode and the second electrode are different.

Preferably the material of the first electrode is selected from Pt, W, Mo, or TiN, more preferably W or TiN and most preferably TiN. Optionally a plug may be applied between the substrate, optionally comprising the CMOS-logic and the first electrode. The plug can be made from W.

Preferably the material of the second electrode is selected from Ag and/or Cu and most preferably Cu. Optionally a plug may be applied onto the second electrode or between the second electrode and the interconnector, if present. The plug can be made from W.

More preferably, the material of the first electrode is selected from Pt, W, Mo, or TiN and the material of the second electrode is selected from Ag and Cu, even more preferably the material of the first electrode is selected from W or TiN and the material of the second electrode is selected from Ag and/or Cu and most preferably the material of the first electrode is TiN and the material of the second electrode is Cu.

In one embodiment the metal of the second electrode and the metal M3 are identical.

The present invention is furthermore directed to a process for the production of the resistive switching memory cell according to the present invention.

Such processes are generally known in the art. Suitable processes are, for example, atomic layer deposition (ALD), chemical vapor deposition (CVD) and physical vapor deposition (PVD), for example sputtering.

Preferably, the process according to the present invention comprises the following steps f) providing a substrate;
g) applying a first electrode on the substrate;
h) applying the switchable solid electrolyte (E) as defined in the present invention on the first electrode;

i) optionally, applying a layer selected from the chalcogenides of Ag, Cu, e.g. sulphides, selenides and tellurides, especially selenides and tellurides, more preferably chalcogenides of Cu, e.g. sulphide, selenide and telluride, especially telluride;

j) applying a second electrode onto the switchable solid electrolyte (E) obtained in step c) or the optional layer selected from the chalcogenides of Ag, Cu, e.g. sulphides, selenides and tellurides, obtained in step d), if present.

Suitable substrates are known in the art.

Usually the substrate features CMOS logic for addressing specific cells for read and/or write operations.

Usually, after applying the second electrode an interconnector is applied onto the second electrode.

After depositing a dielectric layer on the interconnector applied onto the second electrode a three-dimensional structure can be obtained by repeating steps b) to e). This may be repeated several times.

Preferred substrates are selected from silicon-based 1T1R CMOS logic circuitry or 1TnR crossbar logic for improved storage density optionally comprising so-called selectors as, for example, described in S. H. Jo, et al., Cross-Point Resistive RAM Based on Field-Assisted Superlinear Threshold Selector, IEEE Transactions on electron devices, Vol. 62, no 11, November 2015, p. 3477-3481.

An example for an 1T1R assembly is given in FIG. 4. In case of a cross-bar assembly the CMOS-logic is replaced by an interconnector and the CMOS-logic is applied to address the interconnector lines and rows of the assembly.

As already outlined above, methods for applying the individual parts are generally known in the art, e.g. atomic layer deposition (ALD), chemical vapor deposition (CVD) and physical vapor deposition (PVD), for example sputtering.

The application of the switchable solid electrolyte (E) in step c) is preferably carried out by atomic layer deposition (ALD), chemical vapor deposition (CVD) or physical vapor deposition (PVD), for example sputtering.

In case the switchable solid electrolyte (E) is deposited layer by layer, e.g. by atomic layer deposition, the applied layers may comprise only one of the metals M1, M2 or M3 or the applied layers may comprise a mixture of two or more of M1, M2 and M3.

Applying layers only comprising one of the metals M1, M2 or M3 is usually preferred. Thereby side reactions between the precursors of the metals M1, M2 and M3 cannot take place. Moreover, in a mixture of two or more metal precursors the precursor of one of the metals may better physio- and chemisorb with the surface than the precursor of the other metal and, thus, the layer composition, i.e. content of the individual metals in the final layer, may not be identical to the content in the reactant mixture.

In case layers only comprising one of the metals M1, M2 or M3 are applied subsequently the desired concentration in the final switchable solid electrolyte (E) can be easily achieved by selecting the number of the respective layers appropriately.

In either case usually an annealing step is performed after all layers of the switchable solid electrolyte (E) are applied in step c) thereby forming the switchable solid electrolyte (E) according to the invention. It is also possible to apply some of the layers of the switchable solid electrolyte (E) then perform an annealing step and apply further layer(s) of the switchable solid electrolyte (E) then perform another annealing step until all layers of the switchable solid electrolyte (E) are applied. However, applying all layers and performing a single annealing step thereafter is preferred.

The annealing step, if present, is usually performed at a temperature lower than the transition temperature of the oxide, sulphide or selenide of M1, such as 50° C. to 400° C.

In this regard the "transition temperature" denotes the temperature at which a material changes from one state to another, usually from a solid state to a viscous state, e.g. liquid state, or vice versa. Preferably the material is heated to the glass transition temperature or melting temperature of the oxide, sulphide or selenide of M1.

The thickness of the layer is usually 1 to 100 nm, preferably 5 to 10 nm.

Preferred features of the composition and the switchable solid electrolyte (E) of the present invention are also preferred features of the process of the present invention and vice versa.

The present invention is furthermore directed to a memory device comprising the resistive switching memory cell according to the present invention or the resistive switching memory cell prepared according to the process according to the present invention. The resistive switching memory cell is preferably an electrochemical metallization memory (ECM).

Such a memory device may be a solid state disk, a memory card, a USB-stick, a RAM-module, a memory module integrated into an electronic device, e.g. internal memory of a smartphone, digital camera, etc.

Preferred features of the composition and the process of the present invention are also preferred features of the use according to the present invention and vice versa.

EXAMPLES

The invention will now be described with the following non-limiting examples.

Experimental Part

Measurement Methods

Diffusion Coefficient of M2 and M3

The method is performed analogous to the method described by Gunther H. Frischat, in Sodium Diffusion in $SiO_2$ Glass, Journal of The American Ceramic Society, Vol 51, No. 9, 1968, p. 528-530.

The sample was prepared by applying the solution of a radioactive tracer of the metal to be determined onto a polished glass specimen (size 10 mm·10 mm) of Heraeus Infrasil 302® and a second glass specimen of Heraeus Infrasil 302® was applied on top thereof, thereby obtaining a sandwiched structure. Thereafter the specimen was heated to 1100° C. in an oven for an appropriate time. The further procedure was as described in the above paper of Frischat items (2) and (3).

Suitable tracers are known in the art, e.g. 65Cu or 26Al.

Transition Temperature, Glass Transition Temperature, Melting Temperature

Determination of Glass Transition Temperature Tg (Glass)

The glass transition temperature Tg for glasses is determined using a DSC apparatus Netzsch STA 449 F3 Jupiter (Netzsch) equipped with a sample holder HTP 40000A69.010, thermocouple Type S and a platinum oven Pt S TC:S (all from Netzsch). For the measurements and data evaluation the measurement software Netzsch Messung V5.2.1 and Proteus Thermal Analysis V5.2.1 are applied. As pan for reference and sample, aluminum oxide pan GB 399972 and cap GB 399973 (both from Netzsch) with a diameter of 6.8 mm and a volume of about 85 µl are used. An amount of about 20-30 mg of the sample is weighed on the sample pan with an accuracy of 0.01 mg. The empty reference pan and the sample pan are placed in the apparatus, the oven is closed and the measurement started.

A heating rate of 10 K/min is employed from a starting temperature of 25° C. to an end temperature of 1000° C. The balance in the instrument is always purged with nitrogen ($N_2$ 5.0 nitrogen gas with quality 5.0 which represents a purity of 99.999%) and the oven is purged with synthetic air (80% $N_2$ and 20% $O_2$ from Linde) with a flow rate of 50 ml/min. The first step in the DSC signal is evaluated as glass transition using the software described above and the determined onset value is taken as the temperature for $T_g$.

The melting temperature $T_m$ is determined in an analogous manner whereby the maximum in the DSC-signal is evaluated as the melting temperature $T_m$.

Metal Content (of M1, M2, M3, Alkaline and Alkaline Earth Metals Etc.)

The determination was carried out using a Varian Vista MPX ICP-OES instrument (available from Varian Inc.). The system was calibrated using two reference solutions with known metal content in a 3:1 mixture of hydrofluoric acid (40 wt. %) and nitric acid (60 wt. %).

The settings of the Varian Vista MPX ICP-OES instrument were as follows.

Power settings: 1.25 kW
plasma: 15.0 l/min (Argon)
auxiliary gas: 1.50 l/min (Argon)
atomizer pressure: 220 kPa (Argon)
repetitions: 20 s
equilibration time: 45 s
observation height: 10 mm
suction time: 45 s
purging time: 10 s
pumping speed: 20 rpm
repetitions: 3

0.10±0.02 g of the sample are combined with 3 ml nitric acid and 9 ml hydrofluoric acid and heated in an Anton Paar Multiwave 3000 microwave oven at 800 to 1200 W for 60 minutes. The sample is introduced into a 100 nil volumetric flask using hydrochloric acid (50 Vol. %) and used for the measurement.

XRD Measurement

In an air conditioned room with a temperature of 22±1° C. equipment and materials are equilibrated prior the measurement. Crystallinity measurements were performed using a "STOE Stadi P" from STOE & Cie GmbH, Darmstadt, Germany, equipped with a $CuIc_\alpha$ (0.154056 nm) x-ray source, a curved Ge single crystal (111) monochromator, with transmission equipment (detector: linear PSD (position sensitive detector) from STOE), a generator "Seifert ISO-DEBYEFLEX 3003" from GE Sensing and inspection Technologies GmbH (40 kV, 40 mA) and the software "STOE Powder Diffraction Software (win x-pow) Version 3.05" from STOE. This device applies the x-ray scattering measuring principle. Calibration of the device is in accordance with the NIST-standard Si (lot number: 640 c). As reference for the analysis the ICDD database is applied. The sample is placed in a quantity in order to achieve a thin film between two foils (comes with the sample holder from STOE) in the middle of the sample holder prior to placing it in the x-ray beam. The sample was measured in a transmission mode at 22° C. with the following parameters: 2θ: 3.0-99.8°, w: 1.5-49.9°, step: 2θ 0.55°, w: 0.275°, step time: 20 s, measure time: 1.03 h. When plotting 2θ versus intensity using the equipped software package, the presence of peaks representing crystalline material can be detected.

Particles Size Determination Using Laser Scattering

For particle size determination of the particles a laser diffraction method was used according to ISO Standard 13320. A Mastersizer 3000 from Malvern equipped with a He—Ne Laser and a blue LED and wet dispersing unit has been employed for the measurements performed at room temperature of 23° C. The conditions of the wet dispersion unit were set to 80% ultrasonic power before measurement and as a dispersant water was used. The values for $d_{10}$, $d_{50}$, $d_{90}$ were determined using the Malvern software 21 CFR, a form factor of 1 and the Fraunhofer theory.

Porosity and Pore Size by Hg Porosimetry

Mercury porosimetry analysis was performed according to ISO15901-1 (2005). A ThermoFisher Scientific PASCAL 140 (low pressure up to 4 bar) und a PASCAL 440 (high pressure up to 4000 bar) and SOLID Version 1.3.3 (08.02.2012) software (all from ThermoFisher Scientific) were calibrated with porous glass spheres with a pore diameter of 75 nm (University of Leipzig, Fakultät für Chemie und Mineralogie, Institut für Technische Chemie). During measurements the pressure was increased or decreased continuously and controlled automatically by the instrument running in the PASCAL mode and speed set to 6 for intrusion and 8 for extrusion. The Washburn method was employed for the evaluation and the density of Hg was corrected for the actual temperature. The value for surface tension was 0.484 N/m and contact angle 141.1°. The sample size was between about 30 and 40 mg. Before starting a measurement samples were heated to 120° C. for 24 hours. Evacuation is performed automatically by the instrument for 10 minutes to an absolute pressure of 0.01 kPa.

Used Materials

Amorphous $SiO_2$ pyrogenic silica is slurried in deionized water and dried in a drying tower at a temperature of >100° C. thereby obtaining porous silica having a particle size ($d_{50}$) of about 100-500 μm with an inner pore volume of about 0.7 ml/g Al precursor anhydrous $AlCl_3$ obtained from Alfa Aesar Cu precursor anhydrous $CuSO_4$ obtained from Alfa Aesar The compositions have been prepared by infiltration of mixed solution into the inner porosity of porous silica particles as follows. The properties are shown in table 1 below.

Comparative Example 1 (CE1)

0.133 g $CuSO_4$ are added to a round-bottomed flask and dissolved in deionized water. To this solution 500 g of the porous $SiO_2$ as defined above are added and shaken until the mixture shows Newtonian behavior. Subsequently the mixture is dried at 130° C. on a rotary evaporator until a dry powder is obtained. The powder is transferred to an aluminium bowl and dried for 48 h in a drying oven at 150° C. Thereafter the residual humidity is determined and the sample cooled to room temperature (25° C.).

Thereafter the resulting product was heated to 1700° C. under a vacuum of 5 mbar for melting.

Comparative Example 2 (CE2)

Comparative example 1 has been repeated whereby 1.33 g $CuSO_4$ have been used.

Comparative Example 3 (CE3)

Comparative example 1 has been repeated whereby 13.3 g $CuSO_4$ have been used.

Inventive Example 4 (IE4)

The procedure of comparative example 1 has been repeated whereby 0.133 g $CuSO_4$ is added to a round-bottomed flask and dissolved in deionized water. 0.166 g $AlCl_3$ are carefully added. To this solution 500 g of the porous $SiO_2$ as defined above are added and the procedure of comparative example 1 has been repeated.

The properties are shown in table 1 below.

Inventive Example 5 (IE5)

Inventive example 4 has been repeated whereby 1.33 g $CuSO_4$ and 1.66 g $AlCl_3$ as prepared above have been used.

Inventive Example 6 (IE6)

Inventive example 4 has been repeated whereby 13.3 g $CuSO_4$ and 16.6 g $AlCl_3$ as prepared above have been used.

TABLE 1

|     | appearance | Cu [ppm][1] | Al [ppm][1] |
| --- | --- | --- | --- |
| CE1 | slightly red, no inhomogeneity visible | 135 | 8[2] |
| CE2 | individual, separated areas of high Cu-concentration visible under the microscope | 1270 | 1[2] |
| CE3 | individual, separated areas of high Cu-concentration visible under the microscope | 10102 | 0 |
| IE4 | no individual areas as in the case of CE2 and CE3 visible | 169 | 148 |
| IE5 | no individual areas as in the case of CE2 and CE3 visible | 1213 | 1485 |
| IE6 | no individual areas as in the case of CE2 and CE3 visible | 11014 | 14067 |

Figure 1:
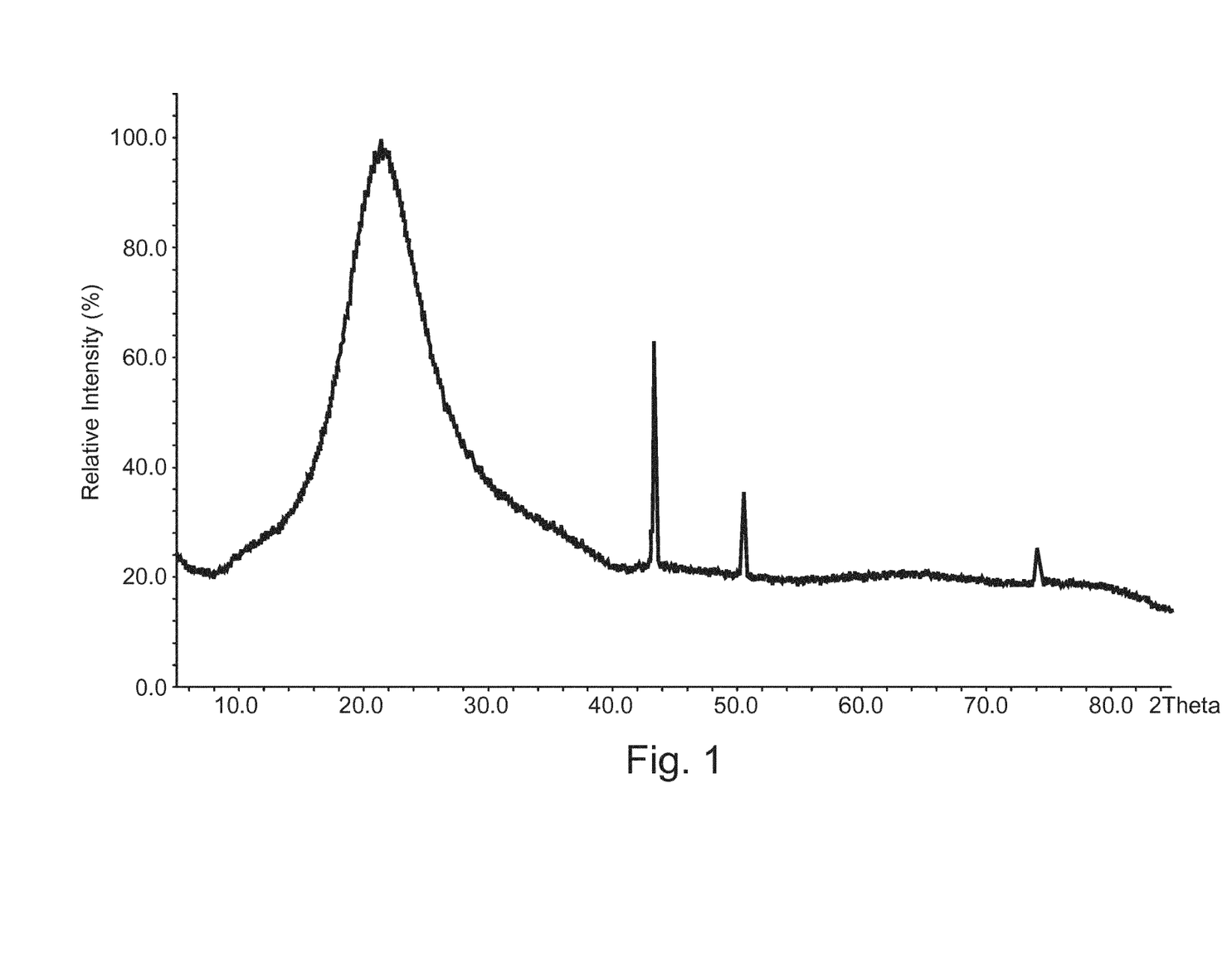
FIG. 1 shows the XRD curve of Comparative Example (sample) 3.
Figure 2:
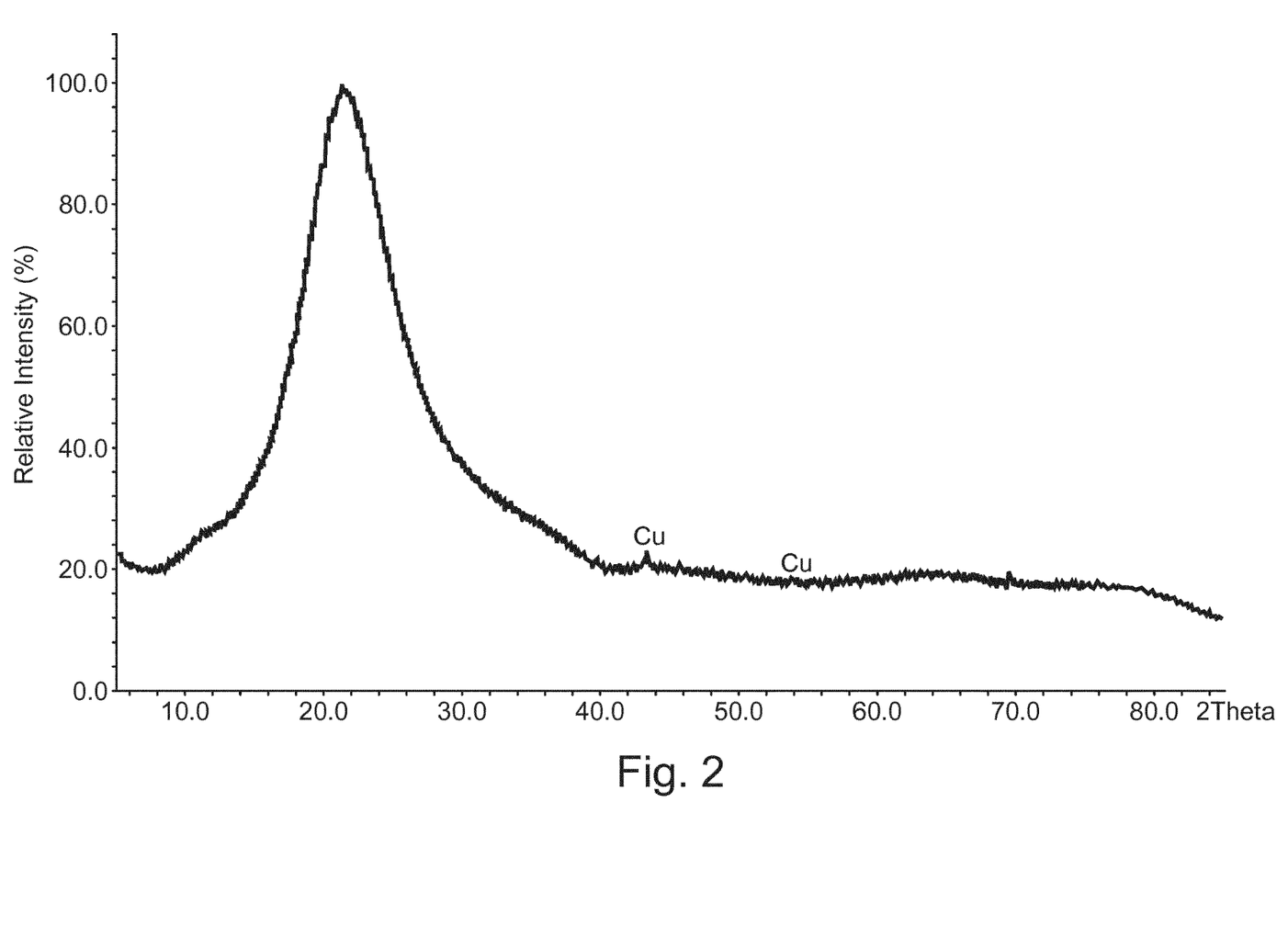
FIG. 2 shows the XRD curve of Inventive Example (sample) 6.

[1] determined in powder form
[2] The minimal Al-content results from impurities due to handling XRD Measurement FIG. 1 shows the XRD curve of sample 3 and FIG. 2 the XRD curve of sample 6. As can be seen from the curves, intensities of the peaks are at about 43.5 2Theta, 50.5 2Theta and 74.0 2Theta and the intensities of inventive sample 6 are significantly lower. These peaks indicate the presence of crystalline metallic copper phases having a size of 100 to 250 nm. Thus, inventive sample 6 has nearly no such phases albeit the copper content is higher compared with comparative example 3.

Sample 6 has been used as sputtering target. Onto a silicon substrate a platinum electrode layer has been applied by sputtering.

Figure 3:
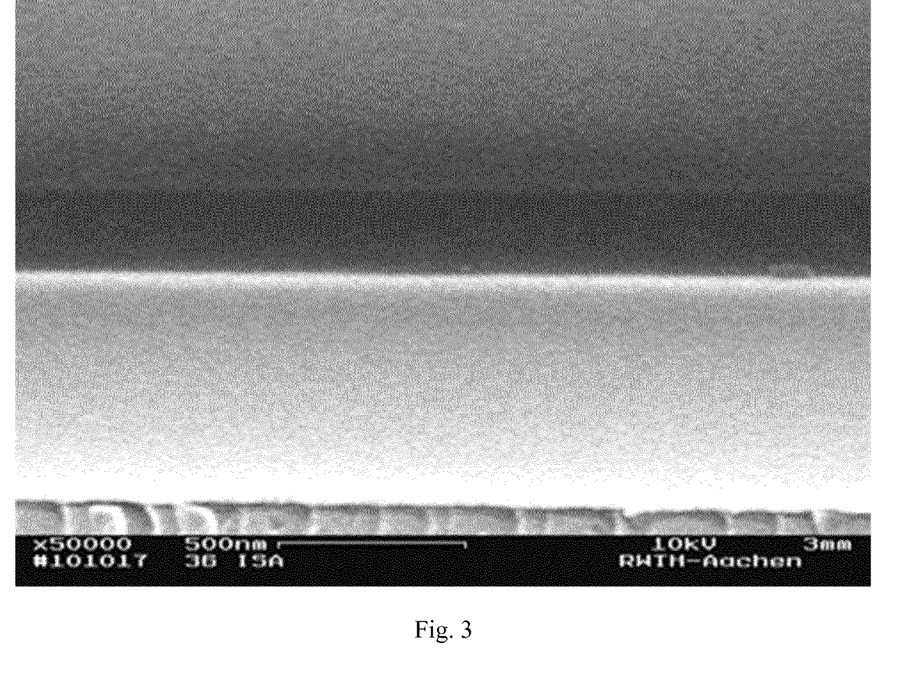
FIG. 3 shows an SEM image of Inventive Example (sample) 6 following use as a sputtering target.

Thereafter a layer of composition 6 as outlined above was applied by radio frequency sputtering at a frequency of 13.56 Mhz, at a power of 150 W (without reflection) at a pressure of 0.002 mbar with the pressure being maintained using 9 sccm (standard cubic centimeters per minute) argon and 1 sccm oxygen. The obtained sample was cleaved and an SEM image has been recorded. The result is shown in FIG. 3. As can be seen from FIG. 3 the platinum forms a homogeneous and amorphous layer (bright area above the coarse substrate). Likewise the Cu and Al-containing composition (dark area on top of the bright area) also forms a homogenous layer not containing any intermetallic phases or the like.

The invention claimed is:

1. A resistive switching memory cell including a switchable solid electrolyte (E), the electrolyte (E) having a composition comprising:
   a matrix comprising a metal oxide as a matrix material, the metal oxide comprising at least two metals M1 and M2, and a metal M3 which is mobile in the matrix, wherein
   the atomic ratio of M1 to M2 is within the range of 75:25 to 99.99:0.01;
   the valence states of M1, M2 and M3 are all positive;
   the valence state of M1 is larger than the valence state of M2;
   the valence state of M2 is equal to or larger than the valence state of M3; and
   the metals M1, M2 and M3 are different, wherein
   M1 is Si or Ge,
   M2 is selected from the group consisting of B, Al, Ga, In, Tl, Sc, Y, La, Ac or mixtures thereof,
   M3 is selected from the group consisting of Ag or Cu, and
   wherein the total concentration of metals different from M1, M2, and M3 in the composition is below 100 ppm, based on the total weight of the composition.

2. The resistive switching memory cell according to claim 1, wherein the ratio of the diffusion coefficient of M3 in the composition to the diffusion coefficient of M2 in the composition is at least 1000:1.

3. The resistive switching memory cell according to claim 1, wherein the resistive switching memory cell is a resistive switching memory cell based on electrochemical metallization.

4. The resistive switching memory cell according to claim 1, wherein the valence state of M1 is +III, +IV, or +V.

5. The resistive switching memory cell according to claim 1, wherein M1 is Si.

6. The resistive switching memory cell according to claim 1, wherein
   the amount of M2 is 0.01 to 25 atom % based on the entirety of metals present in the composition; and
   the amount of M3 is 0.01 to 10 atom % based on the entirety of metals present in the composition.

7. The resistive switching memory cell according to claim 1, wherein the resistive switching memory cell further comprises
   a substrate;
   a first electrode applied onto the substrate;
   the switchable solid electrolyte (E) applied onto the first electrode;
   optionally a layer selected from the chalcogenides of Ag or Cu; and
   a second electrode applied onto the switchable solid electrolyte (E) or the optional layer selected from the chalcogenides of Ag or Cu, if present.

8. The resistive switching memory cell according to claim 7, wherein
   the substrate features CMOS logic for addressing specific cells for read and/or write rations;
   the material of the first electrode is selected from Pt, Mo, W or Tib; and
   the material of the second electrode is selected from Ag or Cu; and
   the second electrode is connected to an interconnector.

9. A process for the production of the resistive switching memory cell according to claim 1, comprising the following steps:
   a) providing a substrate;
   b) applying a first electrode on the substrate;

c) applying the switchable solid electrolyte (E) as defined in claim 1 on the first electrode;

d) optionally, applying a layer selected from the chalcogenides of Ag, or Cu;

e) applying a second electrode onto the switchable solid electrolyte(E) obtained in step c) or the optional layer selected from the chalcogenides of Ag or Cu obtained in step d), if present.

10. A memory device comprising the resistive switching memory cell according to claim 1.

11. The resistive switching memory cell according to claim 1 wherein the atomic ratio of M1 to M2 is within the range of 90:10 to 99.99:0.01.

12. The resistive switching memory cell according to claim 1 wherein M2 is selected from the group consisting of Al or Ga.

13. The resistive switching memory cell according to claim 1 wherein M3 is Cu.

14. A resistive switching memory cell including a switchable solid electrolyte (E), the electrolyte (E) having a composition comprising:

a matrix comprising a metal oxide as a matrix material, the metal oxide comprising at least two metals M1 and M2, and a metal M3 which is mobile in the matrix, wherein the atomic ratio of M1 to M2 is within the range of 75:25 to 99.99:0.01;

the valence states of M1, M2 and M3 are all, positive;

the valence, state of M1 is +III, +IV or +V and is larger than the valence state of M2;

the valence state of M2 is equal to or larger than the valence state of M3;

the metals M1, M2 and M3 are different, with M1 being selected from Si or Ge, M2 being selected from the group consisting of B, Al, Ga, in, TI, Se, Y, La, Ac or mixtures thereof, and M3 being selected from the group consisting of Ag or Cu;

the ratio of the diffusion coefficient of M3 in the composition to the diffusion coefficient of M2 in the composition is at least 1000:1;

in the composition the total concentration of metals different from M1, M2, and M3 is below 100 ppm, based on the total weight of the composition;

the amount of M2 is 0.01 to 25 atom % based on the entirety of metals present in the composition; and the amount of M3 is 0.01 to 10 atom % based on the entirety of metals present in the composition.

15. A resistive switching memory cell including a switchable solid electrolyte (E), the electrolyte (E) having a composition comprising:

a matrix comprising a metal oxide as a matrix material, the metal oxide comprising at least two metals M1 and M2, and a metal M3 which is mobile in the matrix, wherein the atomic ratio of M1 to M2 is within the range of 90:10 to 99.99:0.01;

the valence states of M1, M2 and M3 are all positive;

the valence state of M1 is +III, +IV or +V and is larger than the valence state of M2;

the valence state of M2 is equal to or larger than the valence state of M3;

the metals M1, M2 and MS are different, with M1 being SI, M2 being selected from the group consisting of Al or Ga, and MS is Cu;

the ratio of the diffusion coefficient of MS in the composition to the diffusion coefficient of M2 in the composition is at least 1000:1;

in the composition the total concentration of metals different from M1, M2, and M3 is below 100 ppm, based on the total weight of the composition;

the amount of M2 is 0.01 to 25 atom % based on the entirety of metals present in the composition; and the amount of MS is 0.01 to 10 atom % based on the entirety of metals present in the composition.

* * * * *

UNITED STATES PATENT AND TRADEMARK OFFICE
CERTIFICATE OF CORRECTION

PATENT NO. : 10,777,744 B2
APPLICATION NO. : 16/076148
DATED : September 15, 2020
INVENTOR(S) : Christian Neumann It is certified that error appears in the above-identified patent and that said Letters Patent is hereby corrected as shown below:

In the Claims

Claim 8, Column 14, Line 57, "rations" should be operations;

Claim 14, Column 15, Line 35, "in" should be In;

Claim 15, Column 16, Line 24, "MS" should be M3;

Claim 15, Column 16, Line 25, "SI" should be Si;

Claim 15, Column 16, Line 26, "MS" should be M3;

Claim 15, Column 16, Line 27, "MS" should be M3; and

Claim 15, Column 16, Line 35, "MS" should be M3.

Signed and Sealed this
Fourth Day of May, 2021

Drew Hirshfeld
*Performing the Functions and Duties of the
Under Secretary of Commerce for Intellectual Property and
Director of the United States Patent and Trademark Office*